United States Patent
Li et al.

(10) Patent No.: US 12,414,478 B2
(45) Date of Patent: Sep. 9, 2025

(54) METHOD FOR ETCHING MRAM MAGNETIC TUNNEL JUNCTION

(71) Applicant: JIANGSU LEUVEN INSTRUMENTS CO. LTD, Xuzhou (CN)

(72) Inventors: Jiahe Li, Xuzhou (CN); Yuxin Yang, Xuzhou (CN); Taiyan Peng, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 410 days.

(21) Appl. No.: 18/246,545

(22) PCT Filed: Jun. 17, 2021

(86) PCT No.: PCT/CN2021/100599
§ 371 (c)(1),
(2) Date: Mar. 24, 2023

(87) PCT Pub. No.: WO2022/105218
PCT Pub. Date: May 27, 2022

(65) Prior Publication Data
US 2023/0345840 A1    Oct. 26, 2023

(30) Foreign Application Priority Data
Nov. 23, 2020    (CN) .................. 202011318813.7

(51) Int. Cl.
*H10N 50/01*    (2023.01)
*G11C 11/16*    (2006.01)
(Continued)

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02)

(58) Field of Classification Search
CPC ........ H10N 50/01; H10N 50/80; H10N 50/10; H10B 61/00; G11C 11/161
(Continued)

(56) References Cited

U.S. PATENT DOCUMENTS 7,944,737 B2 * 5/2011 Mani ................... G11C 11/1675
365/158
8,064,245 B2 * 11/2011 Prejbeanu ............. G11C 11/155
365/158
(Continued)

FOREIGN PATENT DOCUMENTS

CN    106676532 A    5/2017
CN    107623014 A    1/2018
(Continued)

OTHER PUBLICATIONS

International Search Report and Written Opinion issued in International Application No. PCT/CN2021/100599; mailed Sep. 23, 2021; 10 pgs.
(Continued)

*Primary Examiner* — Jami Valentine Miller
(74) *Attorney, Agent, or Firm* — HAUPTMAN HAM, LLP

(57) ABSTRACT

A method for etching an MRAM magnetic tunnel junction. The method includes performing a main etching step with an etching amount of t1 by using ion beam etching and/or reactive ion etching, wherein the direction angle of an ion beam is 10°-60°, and the bias voltage of the reactive ion etching is 400 V-1000 V; performing a cleaning step with an etching amount of t2, wherein the bias voltage of the reactive ion etching is 50 V-400 V, the pulse duty ratio is 5%-50%, t1:t2≥0.5, and after the cleaning step is completed, the etching morphology on a bottom electrode or a bottom dielectric layer is square trench; and performing in-situ protection, involving performing in-situ protection on a
(Continued)

coating film. RIE is combined with IBE, and by means of the arrangement of an etching sequence and the selection of etching parameters, the the etching effect of small-sized dense magnetic tunnel junctions is significantly improved.

11 Claims, 2 Drawing Sheets

(51) Int. Cl.
    *H10B 61/00*     (2023.01)
    *H10N 50/10*     (2023.01)
    *H10N 50/80*     (2023.01)

(58) Field of Classification Search
    USPC .............................................................. 438/3
    See application file for complete search history.

(56) References Cited

U.S. PATENT DOCUMENTS

| | | |
|---|---|---|
| 2005/0051820 A1 | 3/2005 | Stojakovic et al. |
| 2013/0146997 A1 | 6/2013 | Lee et al. |
| 2017/0062707 A1* | 3/2017 | Annunziata ......... G03F 7/70325 |
| 2017/0125668 A1 | 5/2017 | Paranjpe et al. |
| 2018/0033957 A1 | 2/2018 | Zhang et al. |
| 2019/0206936 A1* | 7/2019 | Pinarbasi .............. G11C 11/161 |
| 2019/0214553 A1* | 7/2019 | Gajek ..................... H10B 61/22 |
| 2020/0173958 A1* | 6/2020 | Chiang ............. G01N 33/5438 |

FOREIGN PATENT DOCUMENTS

| | | |
|---|---|---|
| CN | 111146335 A | 5/2020 |
| CN | 111162005 A | 5/2020 |
| KR | 20170072870 A | 6/2017 |
| WO | 2020176640 A1 | 9/2020 |

OTHER PUBLICATIONS

First Office Action in Corresponding Chinese Application No. 202011318813.7, dated Mar. 15, 2025; 9 pgs.

* cited by examiner

METHOD FOR ETCHING MRAM MAGNETIC TUNNEL JUNCTION

RELATED APPLICATIONS

The present application is a U.S. National Phase of International Application Number PCT/CN2021/100599 filed Jun. 17, 2021, and claims priority to Chinese Application Number 202011318813.7, filed Nov. 23, 2020.

TECHNICAL FIELD

The present disclosure relates to the field of magnetic random access memory, and in particular to a method for etching an MRAM magnetic tunnel junction.

BACKGROUND

At present, the widely used memory types are SRAM (Static Random Access Memory), DRAM (Dynamic Random Access Memory), Flash (Flash Memory) and the like. SRAM is capable of saving the data stored in it without refreshing the circuit, which has a relatively high performance but a low integration. DRAM has a high integration and a low power consumption, but it needs to refresh the circuit to continuously save data. MRAM (Magnetic Random Access Memory) has the high-speed reading and writing capability of SRAM and the high integration of DRAM, it can be written repeatedly for unlimited times basically, it can be used in systems that need both fast and huge amounts of data storage and data retention after power failure, and it can be recovered quickly. In terms of "nonvolatile" characteristic, only MRAM and FLASH have this function at present, while Flash lacks the "random access" function. This means that MRAM has a broader prospect, especially can play an important role in the fields of automobile, industry, military and space.

Unlike the traditional memory, MRAM stores data in the form of magnetic field polarization rather than charge. The MTJ junction that is the basic structure in the MRAM storage cell is as illustrated in FIG. 1. The uppermost layer is a free layer with a variable magnetic field polarization direction, the middle layer is a tunnel grid layer, and the lower layer is a fixed layer with a fixed magnetic field direction, which are collectively known as the MTJ junction (Magnetic Tunnel Junctions). When the magnetic field direction of the free layer is parallel to that of the fixed layer, the storage cell presents a low resistance. When the magnetic field is in an opposite direction, it presents a high resistance. MRAM determines whether the stored data are 0 or 1 by detecting the resistance of the storage cell.

In the MRAM process, MTJ etching is an extremely critical step. The etching equipment mainly includes a reactive ion etching RIE (Reactive Ion Etching) and an ion beam etching IBE (Ion Beam Etching). RIE is a method of etching by a chemical reaction and a physical ion bombardment. IBE uses an ion beam with certain energy to bombard the material surface for etching, and the directionality is strong. At present, the RIE and IBE etching are the mainstream methods of MTJ etching. Either the IBE etching or the RIE etching, the following requirements need to be satisfied.

1. During etching, it is necessary to maintain the high profile of MTJ junction, which is beneficial to improve the performance and life of TMR (Tunnel Magnetoresistance Resistance).

2. The magnesium oxide layer in MTJ can not have a sidewall contamination (Re-dep), otherwise it will cause a short circuit failure.

3. There is more residual hard mask (HM) and less residual deposition (Residue), which is beneficial to the subsequent process and improves the device survival rate.

As illustrated in FIG. 2, the traditional IBE etching has a relatively high selectivity, but the magnesium oxide layer is damaged greatly and the residual deposition is relatively more. The selection ratio of the traditional ME etching is too low and the profile is relatively poor. Therefore, it is difficult to satisfy the above three etching requirements at the same time.

In addition, with the reduction of the volume of the magnetic memory layer, the spin-polarized current required for writing or conversion operation is also smaller. Therefore, it is expected to make smaller and denser MTJ junction patterns to reduce the damage and shortening of MTJ memory device life caused by control. However, the smaller and denser MTJ junction, using the conventional IBE etching or ME etching, is more difficult to satisfy the above three etching requirements.

SUMMARY

The technical problems to be solved by the present disclosure is to provide a method for etching an MRAM magnetic tunnel in view of the above technical deficiencies in the prior art. In the method for etching the MRAM magnetic tunnel, the traditional RIE is combined with the traditional IBE, and by means of the arrangement of an etching sequence and the selection of etching parameters, the method is suitable for the etching of non-dense magnetic tunnel junctions, while the etching effect of the small-sized dense magnetic tunnel junctions is significantly improved.

In order to solve the above technical problems, the following technical solutions are adopted in the present disclosure.

Provided is a method for etching an MRAM magnetic tunnel junction. The method comprises the following steps.

In Step 1, a main etching step of the magnetic tunnel junction is performed: a main-etching-step etching with an etching amount of t1 is performed on the magnetic tunnel junction by using an ion beam etching and/or a reactive ion etching. A direction angle of an ion beam is 10° to 60°, and a bias voltage of the reactive ion etching is 400 V to 1000 V.

In Step 2, a cleaning step of the magnetic tunnel junction is performed: a cleaning-step etching with an etching amount of t2 is performed on the magnetic tunnel junction that the main etching step is completed, where t1:t2≥0.5. The cleaning-step etching includes the reactive ion etching, a mode of the reactive ion etching is a continuous mode or a pulse mode. A bias voltage of the reactive ion etching is 50 V to 400 V, a pulse duty ratio is 5% to 50%. after the cleaning-step etching is completed, an etching morphology on a bottom electrode or a bottom dielectric layer is a square trench.

In Step 2, the cleaning-step etching is performing in combination of the ion beam etching and the reactive ion etching, a beam voltage of the ion beam etching is 50 V to 200 V.

The method further includes Step 3 of an in-situ protection of the magnetic tunnel junction, a chemical vapor deposition method is adopted to grow a dielectric film layer around the magnetic tunnel junction after the cleaning-step etching is completed for the in-situ protection.

The etching amount t2 in the cleaning-step etching is 5 nm to 100 nm.

In Step 1, the ion beam etching includes a large-angle ion beam etching and a small-angle ion beam etching.

The large-angle ion beam etching refers to the ion beam etching with a direction angle of 30° to 60°, the small-angle ion beam etching refers to the ion beam etching with a direction angle of 10° to 30°. When a time period of the large-angle ion beam etching is T1 and a time period of the small-angle ion beam etching is T2, T1≥1.5 T2.

In the main etching step and the cleaning step, when adopting the ion beam etching, the gas used in an ion beam chamber is one or any combination of inert gas, nitrogen, oxygen, fluoro gas, amino gas, carbon monoxide, carbon dioxide and alcohol.

In the main etching step and the cleaning step, when adopting the reactive ion etching, a power of the ion source in the reaction ion chamber is 50 W to 1000 W, a chamber pressure is 0.5 mT to 10 mT, the gas flow is 10 sccm to 500 sccm, and the gas is one or any combination of inert gas, nitrogen, oxygen, fluoro gas, amino gas, carbon monoxide, carbon dioxide and alcohol.

A length of a lower bottom edge of a square trench is L1, a length of an upper bottom edge of the square trench is L2, a height of the square trench is H1, and an included angle between the lower bottom edge and the side edge of the square trench is α, and L1:L2=0.3 to 1.0, H1:L2=0.1 to 2.0, α=90° to 130°.

Provided is the method for etching the MRAM magnetic tunnel junction. The method includes the following steps.

In Step 1, the main etching step of the magnetic tunnel junction is performed: the main-etching-step etching with an etching amount of t1=35 nm is performed on the magnetic tunnel junction by using the ion beam etching. A method of the ion beam etching is introducing a magnetic tunnel junction sample into an ion beam etching chamber, the direction angle of the ion beam is selected as 25°, energy of the ion beam is 600 V, and a shielding gas is selected sd argon. The magnetic tunnel junction sample includes a mask layer, a cap layer, a MTJ junction, a bottom electrode metal layer and a bottom dielectric layer from a top to a bottom. The bottom dielectric layer is equidistant nested with metal lower electrodes with the same number as the masks in the mask layer, and positions of the metal lower electrodes are in correspondence to the positions of the masks. The ion beam etching stops at the remaining 5 nm of the bottom electrode metal layer; the etching amount of the reactive ion etching is 35 nm.

In Step 2, the cleaning step of the magnetic tunnel junction is performed: the cleaning-step etching with the etching amount of t2=30 nm is performed on the magnetic tunnel junction that the main etching step is completed by using the reactive ion etching. The method of the reactive ion etching is transferring the magnetic tunnel junction sample that the ion beam etching is completed in Step 1 from the ion beam etching chamber to an reactive ion etching chamber through a vacuum chamber to perform the reactive ion etching. Parameters for the reactive ion etching are: a reactive ion pulse is selected as 20%, a power of the ion source is 700 w, a bias voltage is 400 V, the chamber pressure is 5 mT, a flow rate of argon is 100 sccm; the etching amount of the reactive ion etching is 30 nm. After the cleaning-step etching is completed, the etching morphology on the bottom dielectric layer is the square trench.

In Step 3, the in-situ protection of the magnetic tunnel junction is performed: the magnetic tunnel junction sample after the cleaning-step etching is completed is introduced into a plasma enhanced chemical vapor deposition chamber through a vacuum transferring chamber, and a SiN film with 35 nm is plated for the in-situ protection.

Provided is a method for etching the MRAM magnetic tunnel junction. The method includes the following steps.

In Step 1, the main etching step of the magnetic tunnel junction is performed: the main-etching-step etching with the etching amount of t1=20 nm is performed by using the reactive ion etching. A method of the reactive ion etching is introducing the magnetic tunnel junction sample to a reactive ion etching chamber, a power of the ion source in the reactive ion etching is 600 W, and the bias voltage is 600 V, the chamber pressure is 10 mT, the flow rate of argon is 150 sccm. The magnetic tunnel junction sample to be etched includes the mask layer, the cap layer, the MTJ junction, the bottom electrode layer and the bottom dielectric layer from the top to the bottom. The reactive ion etching is stopped at 3 nm where the bottom electrode layer consumes; the etching amount of the reactive ion etching is 20 nm.

In Step 2, the cleaning step of the magnetic tunnel junction is performed: the cleaning-step etching with the etching amount of t2=15 nm is performed on the magnetic tunnel junction that the main etching step is completed by using the reactive ion etching. Etching parameters for the reactive ion etching are: the reactive ion pulse is selected as 30%, the power of the ion source is 300 w, the bias voltage is 600 V, the chamber pressure is 1.5 mT, the flow rate of argon is 200 sccm; the etching amount of the reactive ion etching is t2=15 nm. After the cleaning-step etching is completed, the etching morphology on the bottom electrode or a bottom dielectric layer is the square trench.

In Step 2A, the ion beam cleaning is performed: the magnetic tunnel junction sample after the cleaning-step etching is completed is transferred to the ion beam etching chamber through the vacuum chamber. An angle of the ion beam is selected as 45°, the energy of the ion beam is 100 V, and the argon gas is used for etching, an etching depth remaining on the bottom electrode layer is 3 nm.

In Step 3, the in-situ protection of the magnetic tunnel junction is performed: the magnetic tunnel junction sample after the ion beam cleaning is completed is introduced into the plasma enhanced chemical vapor deposition chamber, through the vacuum transferring chamber, and a SiN film with 10 nm is plated for the in-situ protection.

The present disclosure has the following beneficial effects: in the present disclosure, RIE is combined with IBE, and by means of the arrangement of an etching sequence and the selection of etching parameters, the method is suitable for the etching of non-dense magnetic tunnel junctions, while the etching effect of small-sized dense magnetic tunnel junctions is significantly improved. Therefore, the problems of the selection ration and the profile during dense pattern etching being low are solved. Furthermore, a trench is etched to be of a square, such that the TMR of an MTJ junction can be substantially improved, the service life thereof can be substantially prolonged, and bottom depositions is eliminated.

DETAILED DESCRIPTION OF THE EMBODIMENTS

The present disclosure will be clearly and completely described below with reference to the accompanying drawings and the specific preferred embodiments.

In the description of the present disclosure, it is necessary to understand that the orientation or position relationship indicated by the terms "left", "right", "upper", "lower" and the like is based on the orientation or position relationship as illustrated in the accompanying drawings, which is only for the convenience of describing the present disclosure and simplifying the description, rather than indicating or implying that the device or element referred to must have a specific orientation, be constructed and operated in a specific orientation. "First" "Second" and the like do not indicate the importance of the parts, so it cannot be understood as restrictions on the present disclosure. The specific dimensions used in this embodiment are only for illustration of the technical solutions, and do not limit the protection scope of the present disclosure.

Figure 1:
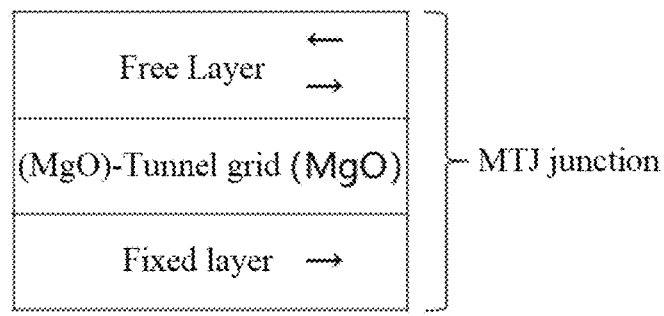
FIG. 1 illustrates a schematic diagram of a magnetic tunnel junction.

As illustrated in FIG. 1, a method for etching an MRAM magnetic tunnel junction comprises the following steps.

In Step 1, a main etching step is performed: an reactive ion etching (RIE) or an ion beam etching (IBE) is performed.

A wafer is introduced into the corresponding reaction chamber, and the primary etching is performed on the magnetic tunnel junction sample to be etched.

Figure 2:
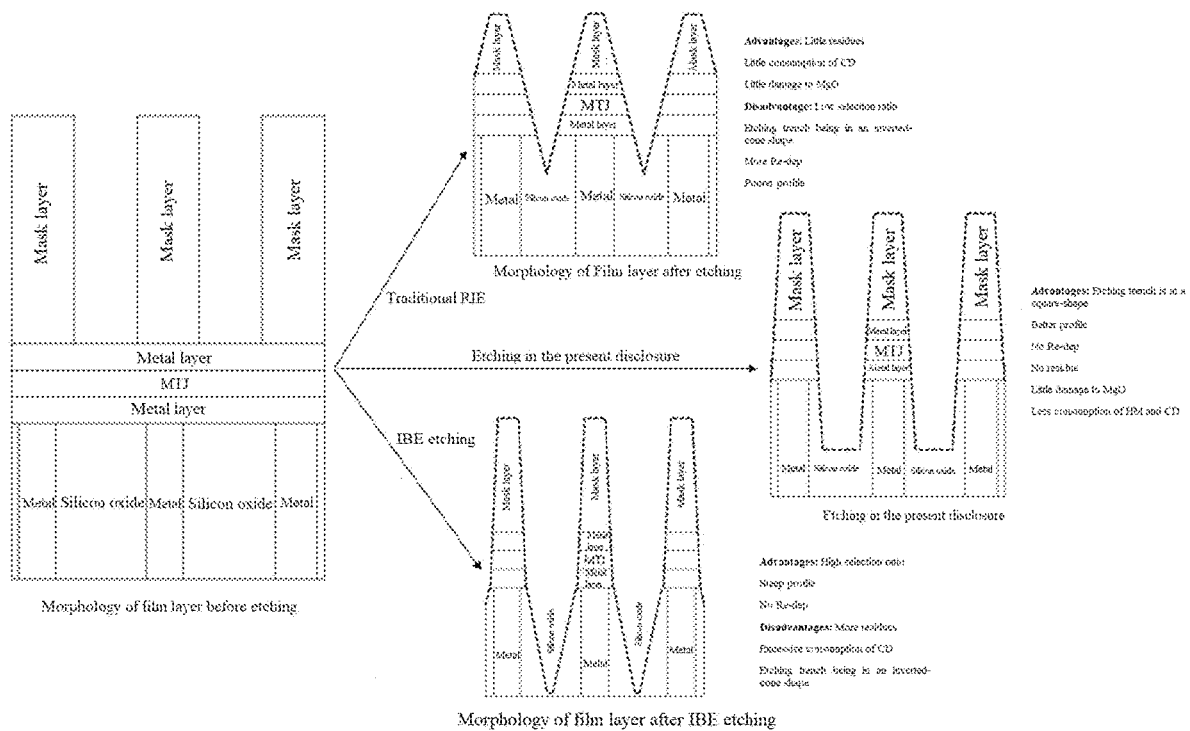
FIG. 2 illustrates a comparison between the etching effect of the present disclosure and that of the traditional RIE etching or the traditional IBE etching. The etching stops on the medium SiO.

As illustrated in FIG. 2, the magnetic tunnel junction sample to be etched includes a mask layer, a metal layer (also called as a cap layer or a cover layer), a MTJ junction, a metal layer (also called as a seed layer) and a bottom dielectric layer from the top to the bottom.

The mask layer includes a plurality of masks evenly spaced on the cap layer. The bottom dielectric layer is equidistant nested with the bottom electrodes with the same number as the mask, and the positions of the bottom electrodes are in correspondence to the positions of the masks. Further, the bottom dielectric layer is preferably silicon oxide and the like.

Figure 4:
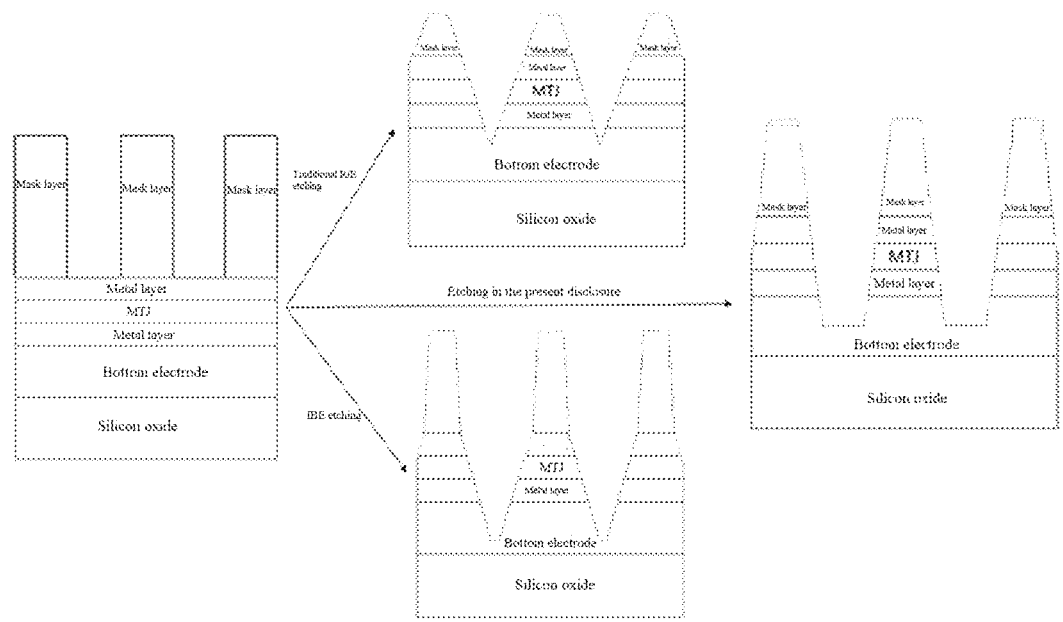
FIG. 4 illustrates the comparison between the etching effect of the present disclosure and that of the traditional RIE etching or the traditional IBE etching. The etching stops on the bottom electrode metal.

As illustrated in FIG. 4, the magnetic tunnel junction sample to be etched includes a mask layer, a metal layer (also called as a cap layer or a cover layer), a MTJ junction, a metal layer (also called as a seed layer), a bottom electrode and a bottom dielectric layer from the top to the bottom. The arrangement of the mask in the mask layer is the same as that in FIG. 2. The bottom dielectric layer is preferably silicon oxide and the like.

The process conditions of ion beam etching IBE are preferably as follows: a direction angle of the ion beam is preferably 10° to 60° (the included angle between the ion beam and the normal line of the wafer), energy is preferably 200 V to 1000 V, a shielding gas is preferably one or various combinations of inert gas, nitrogen, oxygen, fluoro gas, amino gas, carbon monoxide, carbon dioxide, alcohol and the like, and further preferably the inert gases such as argon, krypton, and xenon.

The process conditions of reactive ion etching RIE are preferably as follows: a power of the ion source is 50 W to 1000 W, a chamber pressure is 0.5 mT to 30 mT, a gas flow is 10 sccm to 500 sccm, and the gas is one or any combination of inert gas, nitrogen, oxygen, fluoro gas, amino gas, carbon monoxide, carbon dioxide and alcohol.

In Step 1, an etching amount of the main etching step is t1.

In Step 1, an ion beam etching (IBE) or a reactive ion etching (RIE) is adopted, which preferably has the following beneficial effects.

1. The selection of the direction angle of the ion beam can effectively guarantee the profile of the primary etching and reduce the consumption of CD (the size of magnesium oxide layer in the MTJ junction). RIE main etching can rapidly implement the etching of metal layer, and has less damage to the sidewall of magnesium oxide layer.

In the IBE etching process of the embodiments of the present disclosure, a variable direction angle is preferably adopted for the ion beam, the ion beam etching includes a large-angle ion beam etching and a small-angle ion beam etching. The large-angle ion beam etching is commonly referred to the ion beam etching with a direction angle of 30° to 60°, the small-angle ion beam etching is commonly referred to the ion beam etching with a direction angle of 10° to 30°. When a time period of the large-angle ion beam etching is T1 and a time period of the small-angle ion beam etching is T2, preferably T1≥1.5 T2.

2. The inert gas etching is adopted in the present disclosure, which can obtain a relative high profile and a clean sidewall.

3. The access amount and the profile can be increased, by increasing the proportion of the etching amount t1 in the main etching step.

In Step 2, a cleaning step is performed: the magnetic tunnel junction sample after the main etching step is completed in Step 1 is transferred to the corresponding cleaning step chamber through the vacuum chamber, and the secondary etching of the cleaning step is carried out in the cleaning-step chamber.

There are the following two preferred embodiments in the cleaning-step etching.

The first embodiment is a continuous mode or a pulse mode of the reactive ion etching.

The second embodiment is a continuous mode or a pulse mode of the reactive ion etching, and a low-energy ion beam etching.

The process conditions of reactive ion etching RIE are preferably as follows: an reactive ion pulse Pulsing is preferably 5% to 50%, an ion source power Source is 50 W to 1000 W, a bias voltage is 10 V to 1000 V, a chamber pressure is 0.5 mT to 10 mT, a gas flow is 10 sccm to 500 sccm, and one or any combination of inert gas, nitrogen, oxygen, fluoro gas, amino gas, carbon monoxide, carbon dioxide, alcohol and the like is used, and the inert gas such as argon or oxygen-containing gas is further preferred.

The process conditions of ion beam etching IBE are preferably as follows: the direction angle is preferably 30° to 60° (the included angle between the ion beam and the normal line of the wafer), the energy is preferably 50 V to 200 V, and one or various combinations of inert gas, nitrogen, oxygen, fluoro gas, amino gas, carbon monoxide, carbon dioxide, alcohol and the like are preferred as the shielding gas, and inert gases such as argon, krypton, and xenon are further preferred.

In Step 2, the etching amount of cleaning step is t2, the value of t2 is preferably 5 nm to 40 nm, t1:t2≥0.5. The etching amount ratio of the two-time etching is preferably t1:t2=1.5 to 4.0.

Figure 3:
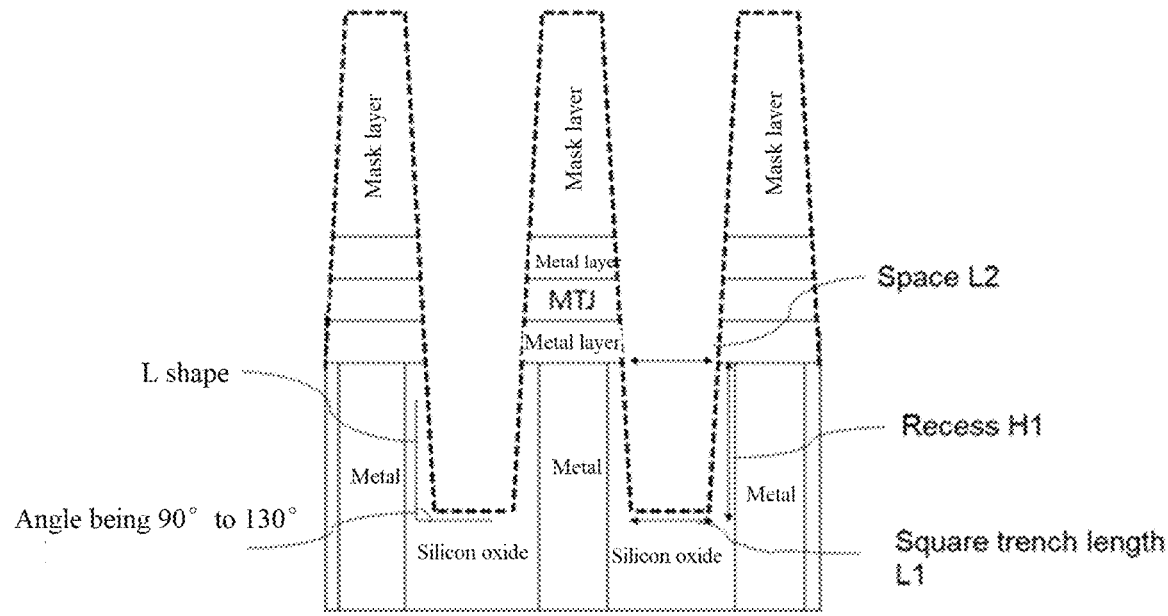
FIG. 3 illustrates a schematic diagram of a morphology of the sample film layer after etching of the present disclosure.

After the secondary etching is completed, the etching morphology on the bottom electrode and/or bottom dielectric layer is a square trench as illustrated in FIG. 3 and FIG. 4.

Provided is a square etching trench of the MRAM magnetic tunnel junction located at the bottom. The square trench is the etching morphology located on the bottom electrode or the bottom dielectric layer, and the shape is a quasi-square. As illustrated in FIG. 2, the square trench is located on the bottom medium layer. As illustrated in FIG. 4, the directional trench is located in the bottom electrode. As an alternative, the square trench can also be located in both the bottom electrode and/or the bottom dielectric layer in FIG. 4.

The length of the lower bottom edge of the square trench (corresponding to the square trench length in FIG. 3) is L1, the length of the upper bottom edge of the square trench (corresponding to the Space in FIG. 3) is L2, the height of the square trench (corresponding to the Recess in FIG. 3) is H1, and the included angle between the lower bottom edge and the side edge of the square trench is α; Then: α=90° to 130°, that is, the trench is approximately an L-shaped, thus forming a quasi-square, preferably L1:L2=0.3 to 1.0, H1:L2=0.1 to 2.0.

Because of the factors such as the charge accumulation effect and the selection ratio, a small-size dense pattern is more difficult to form a square etching trench than a conventional pattern. After the present disclosure is adopted, the obvious square trench characteristic can still be etched in the case where the pattern density reaches 80 nm to 100 nm at pitch.

In step 2, the low-energy ion beam etching or the continuous mode or pulse mode of the reactive ion etching is adopted, which preferably has the following beneficial effects.

1. The low-energy and low-pressure conditions can improve the ability to remove sediment contamination, and ensure that no sidewall contamination will occur under the appropriate process window.

2. The low energy can reduce the damage to the sidewall of the magnesium oxide layer.

3. The inert gas etching such as argon can also obtain a higher profile and a cleaner sidewall. When oxygen-containing gas etching is adopted, the sidewall can be oxidized. When reactive gas etching is adopted, the selection ratio can be increased.

4. The profile of the main etching step is retained, and the final profile is 75° to 90°. Even if the center distance between the two cells is pitch 100 nm, the final profile can also reach greater than 85°.

5. Compared with the traditional single etching method, the selection ratio is greatly improved.

6. A square etching trench can be formed at the bottom. The bottom of the square trench is flat, and there is no or less deposition contamination. The square etching trench can be formed in the dielectric layer or the lower electrode layer. The corners at the bottom of the square trench can be in the shape of "L". After etching the coating film, the film layer still has an obvious "L" shape.

7. An angle of the obtained square trench is 90° to 130°, and the length of the bottom edge L1 of the square trench is 0.5 to 1.0 times of the length of the bottom edge L2 of the square trench. When the Recess: Space is 0.5 to 2 and the aspect ratio (total height: Space) is 1.0 to 5.0, a relative good square trench shape can be achieved.

In Step 3, the film coating is performed: the etched magnetic tunnel junction sample is coated with film. The coating film layer is silicon nitride, silicon oxide or a combination of the two. The thickness of the coating film is 10 nm to 100 nm, and the temperature of the coating film is 150° C. to 350° C. The in-situ protective film can prevent the metal lamination of MTJ from being corroded by water vapor in the air, causing in a short circuit of the device.

The present disclosure adopts the following two specific preferred embodiments for further detailed description.

Example 1

In Step 1, reactive ion etching is used for the main etching step. The magnetic tunnel junction sample as illustrated in FIG. 2 is introduced into the RIE chamber for the main etching. The energy of the main etching step is that: the source power is 500 W, the bias voltage is 600 W, the chamber pressure is 20 mTorr, and an etching gas is Kr.

Reactive ion etching is stopped at the depth from the remaining 10 nm of the lowest metal layer to 40 nm of the bottom dielectric layer. In Example 1, the primary etching is preferably stopped at the depth of the remaining 5 nm of the lowest metal layer, and the etching amount is t1, which is preferably 35 nm.

In Step 2, the combination of reactive ion etching RIE and ion beam etching IBE is used for the cleaning step.

In Step 21, the reactive ion etching RIE: the secondary reactive ion etching is performed on the magnetic tunnel junction sample that the main etching step in Step 1 is completed through a vacuum chamber. The parameters for the secondary reactive ion etching are that: the ion source power is 700 W, the bias voltage is 400 V, the cavity pressure is 5 mT, the flow rate of argon is 100 sccm.

In Step 22, the ion beam etching: the magnetic tunnel junction sample that the secondary reactive ion etching is completed in Step 21 is transferred from RIE to IBE through the vacuum chamber for the ion beam etching. The ion beam etching process conditions are preferably as follows: BMV is 100V, the incident angle is 60°, and the etching gas is Ar. The etching depth, i.e. ion beam etching amount t2=30 nm. After the secondary etching is completed, the etching morphology on the bottom dielectric layer is a square trench.

In Step 3, the film coating is performed: the sample after the ion beam etching is introduced into the plasma enhanced chemical vapor deposition chamber through the vacuum transferring chamber, and the SiN film with 30 nm is plated for the in-situ protection.

The length of the lower bottom edge of the square trench (corresponding to the square trench length in FIG. 3) obtained in this example is L1, the length of the upper bottom edge of the square trench (corresponding to the Space in FIG. 3) is L2, the height of the square trench (corresponding to the Recess in FIG. 3) is H1, and the included angle between the lower bottom edge and the side edge of the square trench is a; Then: α=120°, that is, the trench is approximately an L-shaped, thus forming a quasi-square, L1:L2=0.5, H1:L2=0.5.

Example 2

In Step 1, the reactive ion etching is used for the main etching step: the magnetic tunnel junction sample as illustrated in FIG. 4 is introduced into the reactive ion chamber, the ion source power of the reactive ion etching is 600 W, the bias voltage is 600 V, the chamber pressure is 10 mT, and the flow rate of argon is 150 sccm. The magnetic tunnel junction sample to be etched includes the mask layer, the cap layer, the MTJ junction, the bottom electrode layer and the bottom dielectric layer from the top to the bottom. The reactive ion etching is stopped at 3 nm where the bottom electrode layer consumes. At this time, the etching amount of reactive ion etching is 20 nm.

In Step 2, the reactive ion etching is used for the cleaning step. The secondary etching process conditions are preferably as follows: the reactive ion pulse Pulsing is selected as 5%, the reactive ion source power Source is 300 W, the bias voltage is 600 V, the chamber pressure is 1.5 mT, the flow rate of argon is 200 sccm, the etching is conducted at the height of 30 nm to the seed layer, that is, the etching amount of the reactive ion etching is t2=15 nm. After the secondary etching is completed, the etching morphology on the bottom electrode is the square trench.

In Step 2A, the ion beam cleaning is performed. The secondary etching sample is transferred to the IBE chamber through the vacuum chamber, an angle of the ion beam is selected as 45°, the energy of the ion beam is 100 V, and the argon gas is used for etching, the etching depth remaining on the bottom electrode layer is 3 nm. The morphology comparison is as illustrated in FIG. 4.

In Step 3, the in-situ protection of the magnetic tunnel junction is performed: the magnetic tunnel junction sample after the ion beam cleaning is completed is introduced into the plasma enhanced chemical vapor deposition chamber through the vacuum transferring chamber, and a SiN film with 10 nm is plated for the in-situ protection.

The length of the bottom edge of the square trench of the sample obtained in this example (corresponding to the square trench length in FIG. 3) is L1, the length of the top edge of the square trench (corresponding to the Space in FIG. 3) is L2, the height of the square trench (corresponding to the Recess in FIG. 3) is H1, and the included angle between the bottom edge and the side edge of the square trench is α; Then: α=110°, that is, approximately an L-shaped, thus forming a quasi-square, L1:L2=0.6, H1:L2=0.8.

Example 3

In Step 1, the ion beam etching is used for the main etching step: the magnetic tunnel junction sample is introduced into the ion beam etching chamber, the direction angle of the ion beam is selected as 25°, the energy is 600 V, and the shielding gas is selected as argon for etching. The magnetic tunnel junction samples include the mask layer, the cap layer, the MTJ junction, the bottom electrode metal layer and the bottom dielectric layer from the top to the bottom. The bottom dielectric layer is equidistant nested with metal lower electrodes with the same number as the masks in the mask layer, and the positions of metal lower electrodes are in correspondence to the positions of the masks. The ion beam etching is stopped at the remaining 5 nm of the lowest metal layer, that is, the etching amount of the ion beam t1 is 35 nm.

In step 2, the reactive ion etching is used for cleaning: the magnetic tunnel junction sample that the ion beam etching is completed in Step 1 is transferred from the ion beam etching chamber to the reactive ion etching chamber through the vacuum chamber for the secondary etching. The parameters for secondary etching are that: the reactive ion pulse is selected as 20%, the ion source power is 700 W, the bias voltage is 400 V, the chamber pressure is 5 mT, the flow rate of argon is 100 sccm, and the etching amount of the reactive ion etching t2=30 nm. After the secondary etching is completed, the etching morphology on the bottom dielectric layer is the square trench.

In Step 3, the film coating is performed: the sample after the secondary etching is introduced into the plasma enhanced chemical vapor deposition chamber through the vacuum transferring chamber, and the SiN film with 35 nm is plated for the in-situ protection.

The length of the bottom edge of the square trench of the sample obtained in this example (corresponding to the square trench length in FIG. 3) is L1, the length of the top edge of the square trench (corresponding to the Space in FIG. 3) is L2, the height of the square trench (corresponding to the Recess in FIG. 3) is H1, and the included angle between the bottom edge and the side edge of the square trench is α; Then: α=100°, that is, the trench is approximately L-shaped, thus forming a quasi-square, L1:L2=0.8, H1:L2=1.0.

Example 4

In Step 1, the reactive ion etching is used for the main etching step. The magnetic tunnel junction sample as illustrated in FIG. 2 is introduced into the RIE chamber for the main etching. The energy of the main etching step is the source power of 700 W, the bias power is 400 W, the chamber pressure is 15 mTorr, the chamber pressure is 10 mTorr, and the etching gas is ethanol.

Reactive ion etching is stopped at the depth from the remaining 5 nm of the lowest metal layer to 40 nm of the bottom dielectric layer. In this example, the primary etching is preferably stopped at the interface between the metal and the medium, and the etching amount is t1, which is preferably 20 nm.

In Step 2, the reactive ion etching is used for the cleaning step. The secondary etching is continued in the reactive ion etching chamber. The secondary etching process conditions are preferably as follows: the reactive ion pulse Pulsing is selected as 30%, the reactive ion source power Source is 300 W, the bias voltage is 100 V, the chamber pressure is 5 mT, the flow rate of argon is 200 sccm, the etching is conducted at the height of 30 nm to the seed layer, that is, the etching amount is t2=15 nm. After the secondary etching, the etching morphology on the bottom electrode is the square trench.

In Step 3, the film coating is performed. The sample after the secondary etching is introduced into the plasma enhanced chemical vapor deposition chamber through the vacuum transferring chamber, and the SiN film with 25 nm is plated for the in-situ protection.

The length of the bottom edge of the square trench of the sample obtained in this example (corresponding to the square trench length in FIG. 3) is L1, the length of the top edge of the square trench (corresponding to the Space in FIG. 3) is L2, the height of the square trench (corresponding to the Recess in FIG. 3) is H1, and the included angle between the bottom edge and the side edge of the square trench is α; Then: α=95°, that is, the trench is approximately L-shaped, thus forming a quasi-square, L1:L2=1.0, H1:L2=1.5.

The preferred embodiments of the present disclosure are described in detail above. However, the present disclosure is not limited to the specific details of the above embodiments. Within the scope of the technical concept of the present disclosure, various equivalent transformations can be made for the technical solutions of the present disclosure, which are all within the protection scope of the present disclosure.

What is claimed is:
1. A method for etching an MRAM magnetic tunnel junction, comprising:
   Step 1, a main etching step of the magnetic tunnel junction,: performing a main-etching-step etching with an etching amount of t1 on the magnetic tunnel junction by using an ion beam etching and/or a reactive ion etching, wherein a direction angle of an ion beam is 10° to 60°, and a bias voltage of the reactive ion etching is 400 V to 1000 V; and
   Step 2, a cleaning step of the magnetic tunnel junction: performing a cleaning-step etching with an etching amount of t2 on the magnetic tunnel junction that the main etching step is completed, wherein t1:t2≥0.5; the cleaning-step etching includes the reactive ion etching, a mode of the reactive ion etching is a continuous mode or a pulse mode; a bias voltage of the reactive ion etching is 50 V to 400 V, a pulse duty ratio is 5% to 50%, and after the cleaning-step etching is completed, an etching morphology on a bottom electrode or a bottom dielectric layer is a square trench.

2. The method for etching the MRAM magnetic tunnel junction according to claim 1, wherein in Step 2, the cleaning-step etching is performed in combination of the ion beam etching and the reactive ion etching, wherein a beam voltage of the ion beam etching is 50 V to 200 V.

3. The method for etching the MRAM magnetic tunnel junction according to claim 1, wherein the method further includes Step 3 of an in-situ protection of the magnetic tunnel junction, a chemical vapor deposition method is adopted to grow a dielectric film layer around the magnetic tunnel junction after the cleaning-step etching is completed for the in-situ protection.

4. The method for etching the MRAM magnetic tunnel junction according to claim 1, wherein the etching amount t2 in the cleaning-step etching is 5 nm to 100 nm.

5. The method for etching the MRAM magnetic tunnel junction according to claim 1, wherein in Step 1, the ion beam etching includes a large-angle ion beam etching and a small-angle ion beam etching.

6. The method for etching the MRAM magnetic tunnel junction according to claim 5, wherein the large-angle ion beam etching refers to the ion beam etching with a direction angle of 30° to 60°, the small-angle ion beam etching refers to the ion beam etching with a direction angle of 10° to 30°; when a time period of the large-angle ion beam etching is T1 and a time period of the small-angle ion beam etching is T2, T1≥1.5 T2.

7. The method for etching the MRAM magnetic tunnel junction according to claim 1, wherein in the main etching step and the cleaning step, when adopting the ion beam etching, the gas used in an ion beam chamber is one or any combination of inert gas, nitrogen, oxygen, fluoro gas, amino gas, carbon monoxide, carbon dioxide and alcohol.

8. The method for etching the MRAM magnetic tunnel junction according to claim 1 wherein in the main etching step and the cleaning step, when adopting the reactive ion etching, a power of the ion source in the reaction ion chamber is 50 W to 1000 W, a chamber pressure is 0.5 mT to 10 mT, the gas flow is 10 sccm to 500 sccm, and the gas is one or any combination of inert gas, nitrogen, oxygen, fluoro gas, amino gas, carbon monoxide, carbon dioxide and alcohol.

9. The method for etching the MRAM magnetic tunnel junction according to claim 1, wherein a length of a lower bottom edge of a square trench is L1, a length of an upper bottom edge of the square trench is L2, a height of the square trench is H1, and an included angle between the lower bottom edge and a side edge of the square trench is α, and L1:L2=0.3 to 1.0, H1:L2=0.1 to 2.0, α=90° to 130°.

10. The method for etching the MRAM magnetic tunnel junction according to claim 1, wherein the method comprises following steps:
   Step 1, the main etching step of the magnetic tunnel junction: performing the main-etching-step etching with the etching amount of t1=35 nm on the magnetic tunnel junction by using the ion beam etching, wherein a method of the ion beam etching is introducing a magnetic tunnel junction sample into an ion beam etching chamber, the direction angle of the ion beam is selected as 25° and energy of the ion beam is 600 V, a shielding gas is selected as argon; wherein the magnetic tunnel junction sample includes a mask layer, a cap layer, a MTJ junction, a bottom electrode metal layer and a bottom dielectric layer from a top to a bottom; the bottom dielectric layer is equidistant nested with metal lower electrodes with a same number as the masks in the mask layer, and positions of the metal lower electrodes are in correspondence to positions of the masks; the ion beam etching stops at a remaining 5 nm of the bottom electrode metal layer; and an etching amount of the ion beam etching is 35 nm;
   Step 2, the cleaning step of the magnetic tunnel junction: performing the cleaning-step etching with the etching amount of t2=30 nm on the magnetic tunnel junction that the main etching step is completed by using the reactive ion etching, wherein the method of the reactive ion etching is transferring the magnetic tunnel junction sample that the ion beam etching is completed in Step 1 from the ion beam etching chamber to an reactive ion etching chamber through a vacuum chamber to perform the reactive ion etching; parameters for the reactive ion etching are that: a reactive ion pulse is selected as 20%, a power of the ion source is 700 w, a bias voltage is 400 V, the chamber pressure is 5 mT, a flow rate of argon is 100 sccm; the etching amount of the reactive ion etching is 30 nm; after the cleaning-step etching is completed, the etching morphology on the bottom dielectric layer is the square trench; and
   Step 3, the in-situ protection of the magnetic tunnel junction: introducing the magnetic tunnel junction sample after the cleaning-step etching is completed into a plasma enhanced chemical vapor deposition chamber through a vacuum transferring chamber, and plating a SiN film with 35 nm for the in-situ protection.

11. The method for etching the MRAM magnetic tunnel junction according to claim 1 wherein the method comprises following steps:
   Step 1, the main etching step of the magnetic tunnel junction: performing the main-etching-step etching with the etching amount of t1=20 nm by using the reactive ion etching, wherein a method of the reactive ion etching is introducing the magnetic tunnel junction sample into a reactive ion etching chamber, a power of the ion source in the reactive ion etching is 600 W, and the bias voltage is 600 V, the chamber pressure is 3 mT, the flow rate of argon is 150 sccm; wherein the magnetic tunnel junction sample to be etched includes the mask layer, the cap layer, the MTJ junction, the bottom electrode layer and the bottom dielectric layer from the top to the bottom; the reactive ion etching is stopped at 3 nm where the bottom electrode layer consumes; the etching amount of the reactive ion etching is 20 nm;

Step 2, the cleaning step of the magnetic tunnel junction: performing the cleaning-step etching with the etching amount of t2=15 nm on the magnetic tunnel junction that the main etching step is completed by using the reactive ion etching, wherein etching parameters for the reactive ion etching are that: the reactive ion pulse is selected as 5%, the power of the ion source is 300 w, the bias voltage is 600 V, the chamber pressure is 1.5 mT, the flow rate of argon is 200 sccm; the etching amount of the reactive ion etching is t2=15 nm; after the cleaning-step etching is completed, the etching morphology on the bottom dielectric layer is the square trench;

Step 2A, the ion beam cleaning: transferring the magnetic tunnel junction sample after the cleaning-step etching is completed to the ion beam etching chamber through the vacuum chamber, wherein an angle of the ion beam is selected as 45°, the energy of the ion beam is 100 V, and the argon gas is used for etching, an etching depth remaining on the bottom electrode layer is 3 nm; and Step 3, the in-situ protection of the magnetic tunnel junction: introducing the magnetic tunnel junction sample after the ion beam cleaning is completed into the plasma enhanced chemical vapor deposition chamber, through the vacuum transferring chamber, and plating a SiN film with 10 nm for the in-situ protection.

* * * * *